United States Patent [19]
Belkhale et al.

[11] Patent Number: 6,023,566
[45] Date of Patent: Feb. 8, 2000

[54] CLUSTER MATCHING FOR CIRCUIT IMPLEMENTATION

[75] Inventors: Krishna Belkhale, Campbell, Calif.; Sumit Roy, Evanston, Ill.; Devadas Varma, Fremont, Calif.

[73] Assignee: Cadence Design Systems, San Jose, Calif.

[21] Appl. No.: 08/837,155

[22] Filed: Apr. 14, 1997

[51] Int. Cl.[7] .................................................. G06F 15/00
[52] U.S. Cl. ................................ 395/500.03; 395/500.08
[58] Field of Search .................................... 364/488, 489, 364/490, 491

[56] References Cited

U.S. PATENT DOCUMENTS

| | | | |
|---|---|---|---|
| 4,336,468 | 5/1982 | Spillman | 307/440 |
| 5,784,636 | 7/1998 | Rupp | 395/800.37 |
| 5,787,010 | 7/1998 | Schaefer | 364/489 |

OTHER PUBLICATIONS

Hatchel and Somenzi, "*Logic Synthesis and Verification Algorithms*", Kluwer Academic Publishers, 1996.

De Micheli, "*Synthesis and Optimization of Digital Circuit*", McGraw Hill, Inc. 1994.

Mohnke and Malik, "Limits of Using Signatures for Permutation Independent Boolean Comparison", Proceedings of the ASP–DAC'95/CHDL'95/ VLSI'95 Asia and South Pacific Design Automation Conference, Aug. 29–Sep. 1, 1995.

Bryant, "Graph–Based Algorithms for Boolean Function Manipulation", IEEE Transactions on Computers, vol. C–35,, No. 8 p. 670 Aug. 1986.

Pomeranz and Reddy, "On Diagnosis and Correction of Design Errors" IEEE/ACM International Conference on Computer–Aided Design, NOv. 7–11, 1993.

Lai, Sastry, and Pedram, "Boolean Matching Using Binary Decision Diagrams with Applications to logic Synthesis and Verification", 1992 IEEE International Conference on Computer Design: VLSI in Computers & Processors, Oct. 11–14, 1992.

(List continued on next page.)

*Primary Examiner*—Kevin J. Teska
*Assistant Examiner*—Thuan Do
*Attorney, Agent, or Firm*—Michael A. Glenn

[57] ABSTRACT

Provided are a method, article of manufacture, and apparatus for matching candidate clusters to cells in a technology library. An automated design system comprises a computer configured to use second order signatures in generating candidate permutations of each permutation group in a canonical form of the candidate function. The system selects first and second symmetric subgroups, determines a second order signature for the candidate function and the first and second symmetric subgroups, and compares the second order signature to a corresponding second order signature for a library cell function. If the signatures match, the permutation is continued with the first and second symmetric subgroups being included in an intermediate permutation. If not, the system produces no more intermediate permutations beginning with the first and second symmetric subgroups. Further symmetric subgroups are added to the intermediate permutation. For each new symmetric subgroup, the system produces pairings of that symmetric subgroup with each of the symmetric subgroups in the intermediate permutation, and compares the second order signatures of the pairings to corresponding second order signatures in the library function. If at any time any of the second order signatures do not match their corresponding library function signatures, the system produces no more intermediate permutations beginning with the current sequence of the intermediate permutation, and instead removes the new symmetric subgroup and attempts to continue building the previous intermediate permutation. When all symmetric subgroups in the permutation group have been added to the intermediate permutation, the intermediate permutation becomes a candidate permutation.

20 Claims, 10 Drawing Sheets

OTHER PUBLICATIONS

Clarke et al., Spectral Transforms for Large Boolean Functions with Applications to Technology Mapping, 30$^{th}$ Design Automation Conference, Jun. 14–18,1993, Dallas, Texas.

Mailhot and De Micheli, "Technology Mapping Using Boolean Matching and Don't Care Sets", Proceedings of the European Conference on Design Automation, 1990, p. 212–216.

Library Cells

| Cell | Inputs | Function |
|---|---|---|
| INV | a | !a |
| AND | a, b | a & b |
| NOR | a, b | !a & !b |
| AO1 | a, b, c | !(a & (b \| c)) |
| AO2 | a, b, c, d | (a \| b) & (c \| d) |

*FIG. 3B*

| Variables | Symmetric Subgroups of Variables | Permutation Groups of Symmetric Subgroups |
|---|---|---|
| $X_1$ $X_2$ $X_{n_{11}}$ | $S_{11}$ | |
| $X_{n_{11}+1}$ $\vdots$ $X_{n_{12}}$ $\vdots$ | $S_{12}$ | $PG_1$ |
| $X_{n_{1(m_1-1)}+1}$ $\vdots$ $X_{n_{1m_1}}$ $\vdots$ | $S_{1m_1}$ | |
| $X_{n_{i-1\ m_{i-1}}+1}$ $\vdots$ $X_{n_{i1}}$ $\vdots$ | $S_{i1}$ | $PG_i$ |
| $X_{n_{i(m_i-1)}+1}$ $\vdots$ $X_{n_{im_i}}$ $\vdots$ | $S_{im_i}$ | |

*FIG. 6*

CLUSTER MATCHING FOR CIRCUIT IMPLEMENTATION

INTRODUCTION

1. Technical Field

This invention relates to a method, article of manufacture, and apparatus for logic synthesis and mapping a technology-independent network to a technology-dependent network in the design of integrated circuits. More particularly, this invention relates to matching portions of circuits to portions of circuits stored in a technology library.

2. Background

In the design of integrated circuits, there is a tradeoff between competing design goals: area of the circuit, critical path delay (speed) of the circuit, testability of the circuit, and power consumption of the circuit. The rapidly growing complexity in very large scale integrated (VLSI) circuits and the sheer mass of detail in VLSI designs necessitates the use of automated synthesis tools in order to design an optimized circuit which balances all of these design constraints. Logic synthesis is described in *Logic Synthesis and Verification Algorithms*, by Gary D. Hachtel and Fabio Somenzi, and in *Synthesis and Optimization of Digital Circuits*, by Giovanni De Micheli, the disclosures of which are hereby incorporated by reference.

Automated design systems are used in converting logic designs to specific circuits in the production of application specific integrated circuits (ASICs). This typically involves mapping the logic design, called a "technology-independent circuit" (or network), into one or more logic gates in a pre-designed set of gates called a technology library. The resulting circuit may be variously called "technology-dependent", "technology-mapped", or simply "mapped".

The technology library depends on the manufacturer and the target technology selected. For example, target technologies might include CMOS (complementary metal-oxide-semiconductor), NMOS (n-type metal-oxide-semiconductor), PMOS (p-type metal-oxide-semiconductor), TTL (bipolar transistor-to-transistor logic), and ECL (emitter-coupled logic).

Further differentiation among target technologies may be based on minimum feature size, resulting in, for example, a 0.25 micron CMOS technology, a 1.0 micron CMOS technology, and a 2.0 micron CMOS technology.

Initially, the logic design may be specified in the form of Boolean equations or an HDL (hardware description language) description in a language such as Verilog or VHDL (Very High Speed Integrated Circuits Hardware Description Language). The automated design system generates a technology-independent, unmapped network that is a directed graph where the vertices (nodes) represent logic gates and the edges represent the nets connecting the gate outputs to gate inputs. This technology-independent network is optimized and mapped, producing a technology-mapped network. Typically, some restructuring is performed in order to meet specified design criteria (delay times, area, etc.). This is generally a repetitive optimizing process that involves countless changes to the logic network, with many recalculations of various network parameters after each change. One such parameter is speed, which is related to the time required for a change in one of the inputs to travel through the network to produce a change in one of the outputs. Another parameter is area, which is generally related to the number of transistors required to implement a given design.

The task of technology mapping may typically be divided into two steps. In the first step, it is necessary to determine, at each node of the technology independent circuit, a set of groupings of nodes and edges having the node as the root. These groupings are called "candidate clusters". A check is then performed to determine whether each cluster is "realizable"; i.e., the cluster can be implemented by a cell from the technology library. A cluster is considered realizable if the cluster's function can be implemented by a cell in the library, either directly, or by inverting the inputs, permuting the inputs, or inverting the outputs (i.e. if the cluster's function is "NPN equivalent" to a cell in the library). The Boolean functions of the candidate cluster and cells in the library are compared using Boolean function matching techniques, as described in Frederic Mailhot and Giovanni De Micheli, "Technology Mapping Using Boolean Matching and Don't Care Sets", Proceedings of the European Conference on Design Automation, p. 212–216 (1990); E. M. Clarke, K. L. McMillan, X. Zhao, M. Fujita, and J. Yang, "Spectral Transforms for Large Boolean Functions with Applications to Technology Mapping," Proceedings of 30th ACM/IEEE Design Automation Conference, p. 54–60 (1993); J. Mohnke, P. Molitor, and S. Malik, "Limits of Using Signatures for Permutation Independent Boolean Comparison," Proceedings of 1995 ACM/IEEE International Workshop on Logic Synthesis, p. 459–464 (1995), the disclosures of which are hereby incorporated by reference.

In the second step, the realizable clusters are used to completely cover the technology-independent network. As stated above, this is done while attempting to meet design constraints while minimizing area to the extent possible.

Current automated design systems generally use signatures and symmetry information to perform Boolean function matching, and such signatures may be based on Walsh coefficients. Comparison of signatures is used to exclude functions that do not match the function of the candidate cluster (the candidate Boolean function). However, with existing techniques, some types of networks result in a very large number of permutations required, with a corresponding increase in computation time.

The limitations in prior art matching techniques reduces the ability of the system to map larger and more complex cells, and largely renders it incapable of matching some types of functions such as multiplexers, due to the explosion in the number of permutations that may be required. This results in poor quality of technology mapping and inability to map to large cells, with suboptimal results.

The need exists, therefore, for more effective Boolean function matching for use in technology mapping.

SUMMARY OF THE INVENTION

Briefly, therefore, this invention provides for a method, article of manufacture, and apparatus for matching candidate clusters to cells in a technology library. An automated design system comprises a computer configured to extract a portion of a circuit, generate candidate clusters, and use signatures to match the candidate clusters to cells in the technology library. In an embodiment of the invention, the automated design system processes a circuit to be mapped to a chosen technology. The system generates candidate clusters and for each candidate cluster, attempts to match it to a cell in the technology library. If necessary, the system produces candidate permutations of each permutation group in a canonical form of the candidate function, using second order signatures to guide the production of candidate permutations. The system selects first and second symmetric subgroups, determines a second order signature for the candidate function and the first and second symmetric subgroups, and compares the second order signature to a corresponding second order signature for the library cell function. If the second order signatures match, the permutation is continued with the first and second symmetric subgroups being included in an intermediate permutation. If not, the system produces no more intermediate permutations beginning with the first and second symmetric subgroups.

Further symmetric subgroups may be added to the intermediate permutation and checked. With each new symmetric subgroup added, the system produces pairings of the new symmetric subgroup with each of the symmetric subgroups in the intermediate permutation, and compares the second order signatures of the pairings to corresponding second order signatures in the library function. If at any time any of the second order signatures do not match their corresponding library function signatures, the system produces no more intermediate permutations beginning with the current sequence of the intermediate permutation, and instead removes the new symmetric subgroup and attempts to continue building the previous intermediate permutation. When all symmetric subgroups in the permutation group have been added to the intermediate permutation, and all second order signatures have passed the consistency check, the intermediate permutation becomes a candidate permutation.

The advantages and further details of the present invention will become apparent to one skilled in the art from the following detailed description when taken in conjunction with the accompanying drawings.

BRIEF DESCRIPTION OF THE DRAWINGS

In the accompanying drawings:

FIG. 3(b) is a table of cells in a technology library;

FIG. 6 is a table illustrating the result of generating the canonical form of the function in accordance with the invention;

DESCRIPTION OF THE INVENTION

Figure 1:
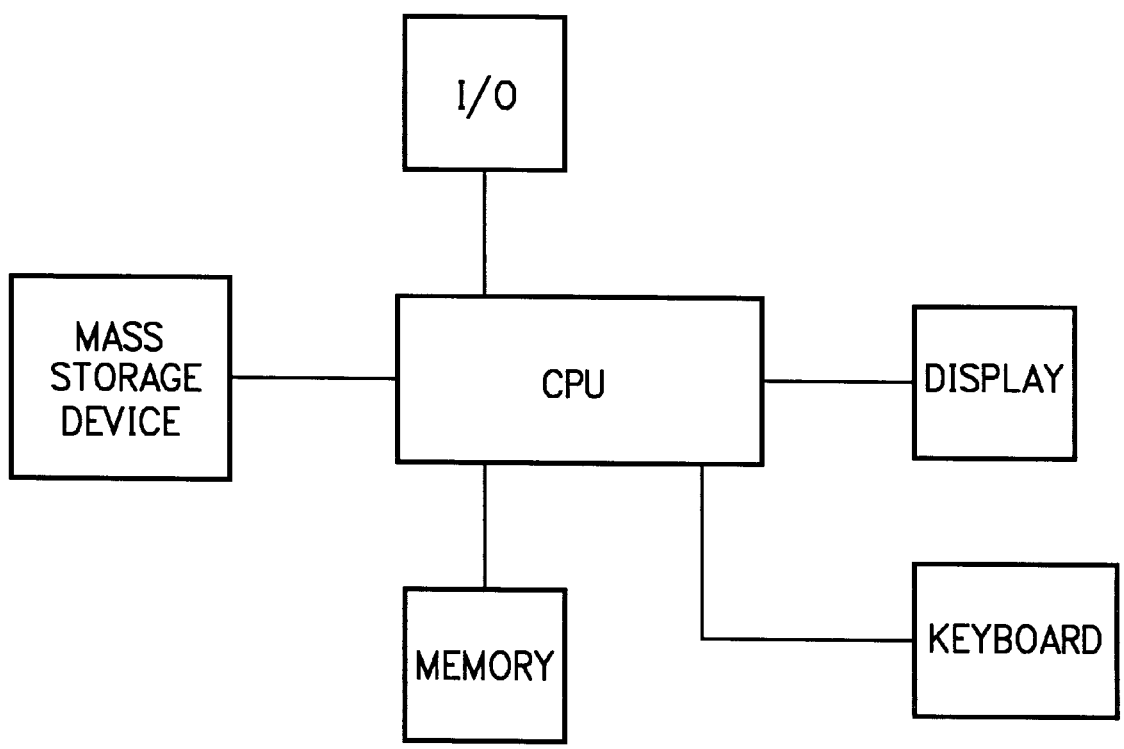
FIG. 1 is a schematic of an automated design system in accordance with the invention.

In accordance with the invention, an automated design system comprises a computer configured to convert a logic design to a specific circuit. In an embodiment of the invention, the automated design system is in the form of a software program being executed on a general-purpose computer such as a DEC Alpha or an Intel Pentium-based PC running Linux. Other means of implementing the automated design system may be used, such as a special-purpose hardwired system with instructions burned into a chip. As is usual in the industry, the computer may have memory, a display, a keyboard, a mass storage device, and other input or output devices, shown in FIG. 1. In accordance with common practice, the memory and the mass storage device can be used to store program instructions and data.

The system is configured to map the logic design into one or more logic gates from a chosen technology library. The technology library may vary depending on the manufacturer and the product line selected. For example, the target technologies may include different processes such as CMOS, NMOS, PMOS, TTL, or ECL with different minimum feature sizes, and emphasize different performance goals. One target technology may emphasize minimum area and power consumption, while another target technology emphasizes speed.

Typically, the logic design is initially provided in the form of Boolean equations or an HDL (hardware description language) description in a language such as Verilog or VHDL (Very High Speed Integrated Circuits Hardware Description Language). The automated design system converts this to a technology-independent, unmapped network that is a directed graph where the vertices represent logic gates and the edges represent the nets connecting the gate outputs to gate inputs.

Figure 2A:
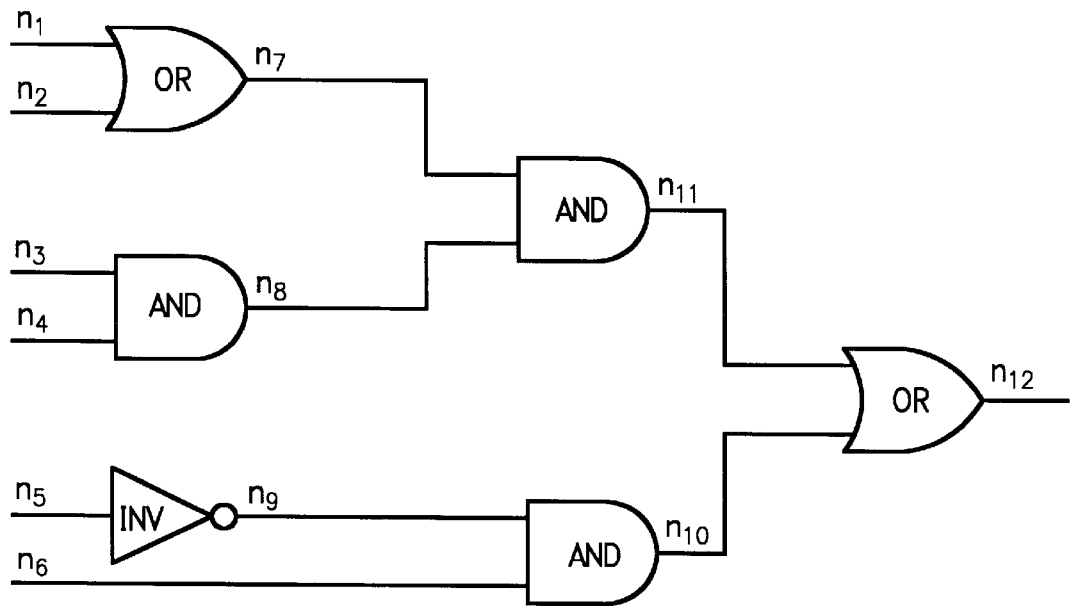
FIG. 2(a) is a schematic of a technology-independent network.
Figure 2B:
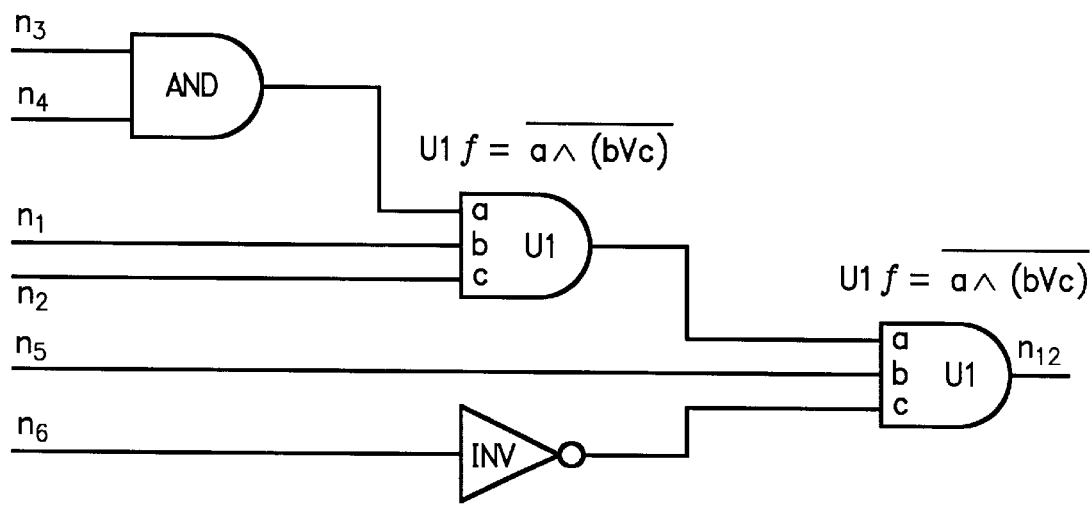
FIG. 2(b) is a schematic of a technology-dependent network equivalent to the network of FIG. 2(a)

The gates in the technology-independent network are generally primitive gates such as AND, OR, NAND, NOR, and INV gates. The gates in the technology library may include primitive gates and gates with complex combinational functions. For example, a technology-independent network as shown in FIG. 2(a) might map to the technology-dependent network shown in FIG. 2(b). The technology-dependent network uses a complex gate U1, which is a cell with three inputs A, B, and C, and has the function NOT (A AND (B OR C)). This gate might be represented in the technology library by its Boolean function in the form of a binary decision diagram (BDD), which facilitates comparison with another combinational function for equality, or in the form of a truth table. Both networks result in the function $((n_1$ OR $n_2)$ AND $(n_3$ AND n4) OR ((NOT $n_5$) AND n6)). Typically, the technology library also stores delay information for estimating the performance of a mapped circuit, and other information used by the automated design system.

The Verilog description corresponding to the circuit of FIG. 2(a) would be as follows:

```
module sample (n1, n2, n3, n4, n5, n6, n12);
    input n1, n2, n3, n4, n5, n6;
    output n12;
    wire n7, n8, n9, n10, n11;
    assign n7 = n1 | n2;
    assign n8 = n3 & n4;
    assign n11 = n7 & n8;
    assign n9 = !n5;
    assign n10 = n9 & n6;
    assign n12 = n11 | n10;
endmodule
```

A logic optimizer optimizes the technology-independent network, which is then mapped by a mapper to produce a technology-mapped, or technology-dependent, network. The technology mapping includes the following two steps: determine realizable clusters for each node in the technology-independent network; and choose covering cells from the technology library so that the technology-independent network is completely mapped. The first step may further be broken down into the following two sub-steps: generate candidate clusters; and determine which candidate clusters are realizable.

The check for determining realizable clusters after generating candidate clusters can be thought of as follows:

```
procedure generateRealizableClusters ( node n )
n -> SetOfRealizableClusters = { }
for each candidate cluster ( C ) at node n
    {
        if ( foundAMatchWithLibrary (C) )
        {
            Add C into n -> SetOfRealizableClusters;
        }
    }
```

Figure 3A:
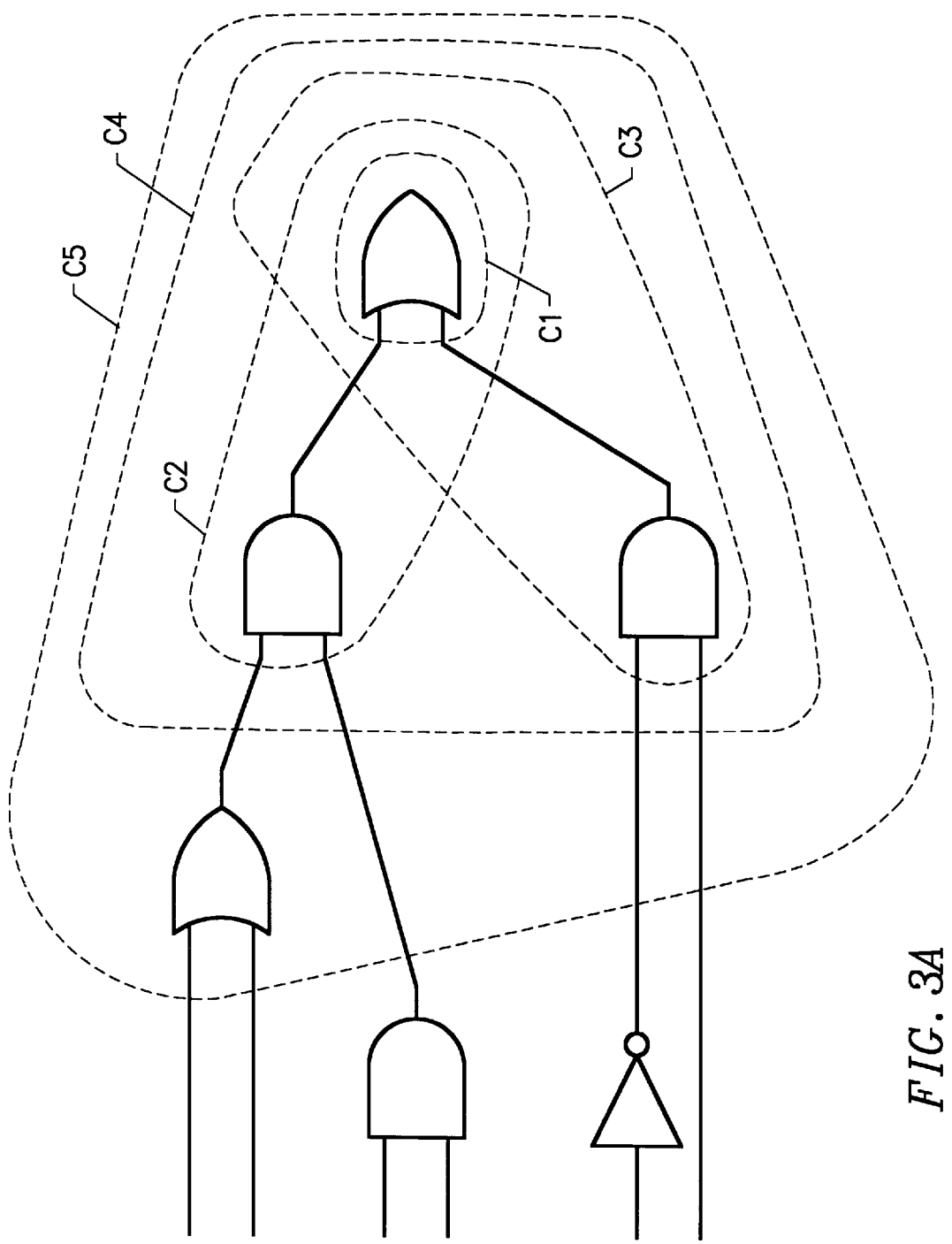
FIG. 3(a) is a schematic of a technology-independent network.
Figure 3C:
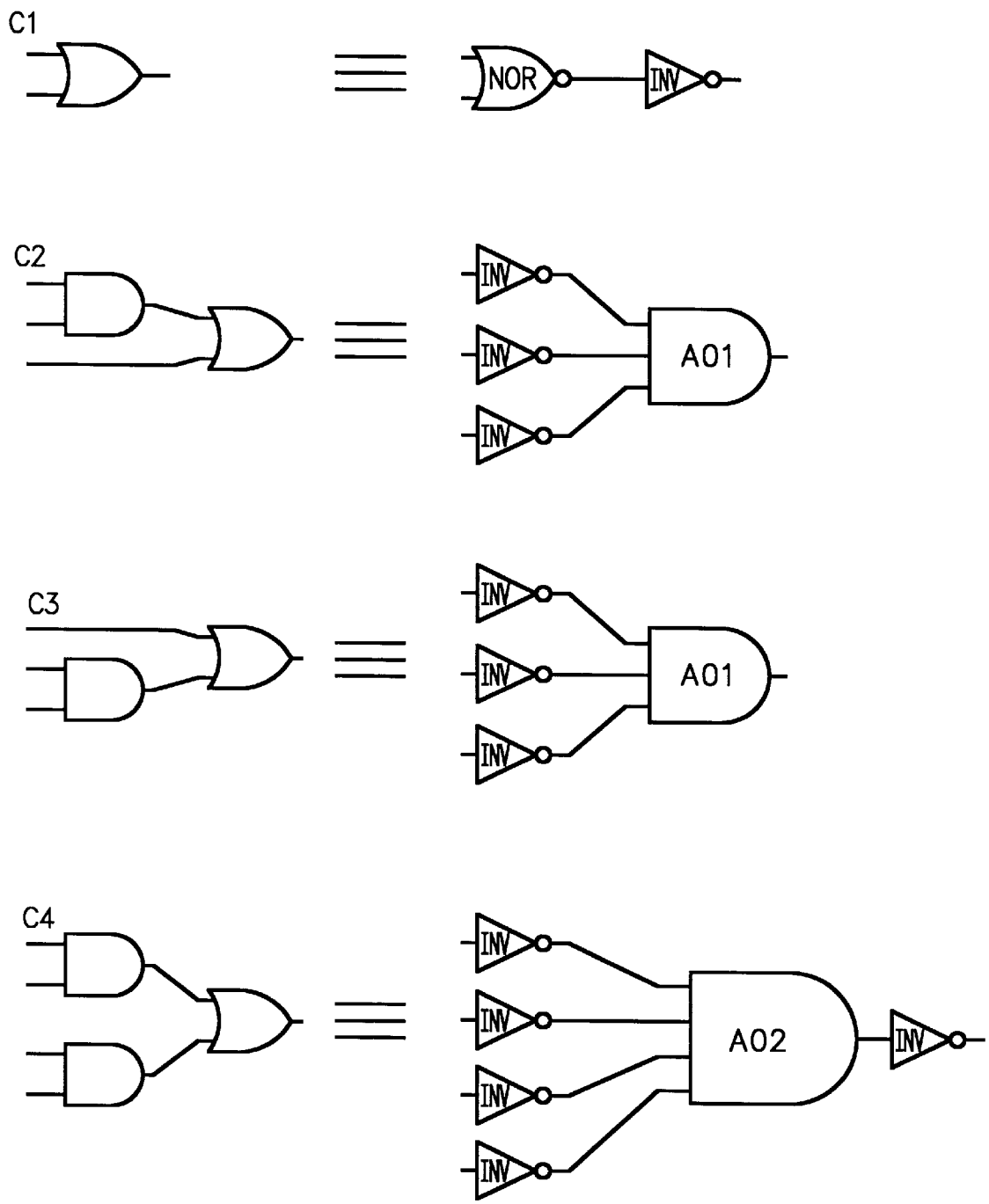
FIG. 3(c) is a schematic showing the matching of clusters found in the network of FIG. 3(a) to the library cells listed in the table of FIG. 3(b)

This is illustrated at FIGS. 3(a)–(c). The check for realizability is performed using a Boolean matching technique, as will be described below. FIG. 3(a) shows the candidate clusters identified by the system and checked against the library cells shown in the table of FIG. 3(b). FIG. 3(c) illustrates some clusters being matched to cells in the library. These clusters are termed "realizable." Cluster C5 is not realizable in the library and therefore no match is made.

In matching clusters to cells in the library, the Boolean function of the candidate cluster is compared to the Boolean function of a cell in the library. A candidate Boolean function f is said to match a library cell Boolean function g if there exists some permutation of the inputs that makes the function f equal to the function g, possibly requiring some inversions at the inputs and/or at the output. This notion of equivalence is referred to as NPN equivalence (Negate Permute Negate), and can be more formally stated as follows:

Given a Boolean function f with inputs $X_1, X_2, X_3 \ldots X_n$, find a permutation P and inversions at input b1, b2, b3 ... bn and at output b such that
$f^b (P(X_1^{b1} \ldots X_n^{bn}))$
exists in the library.

Figure 4:
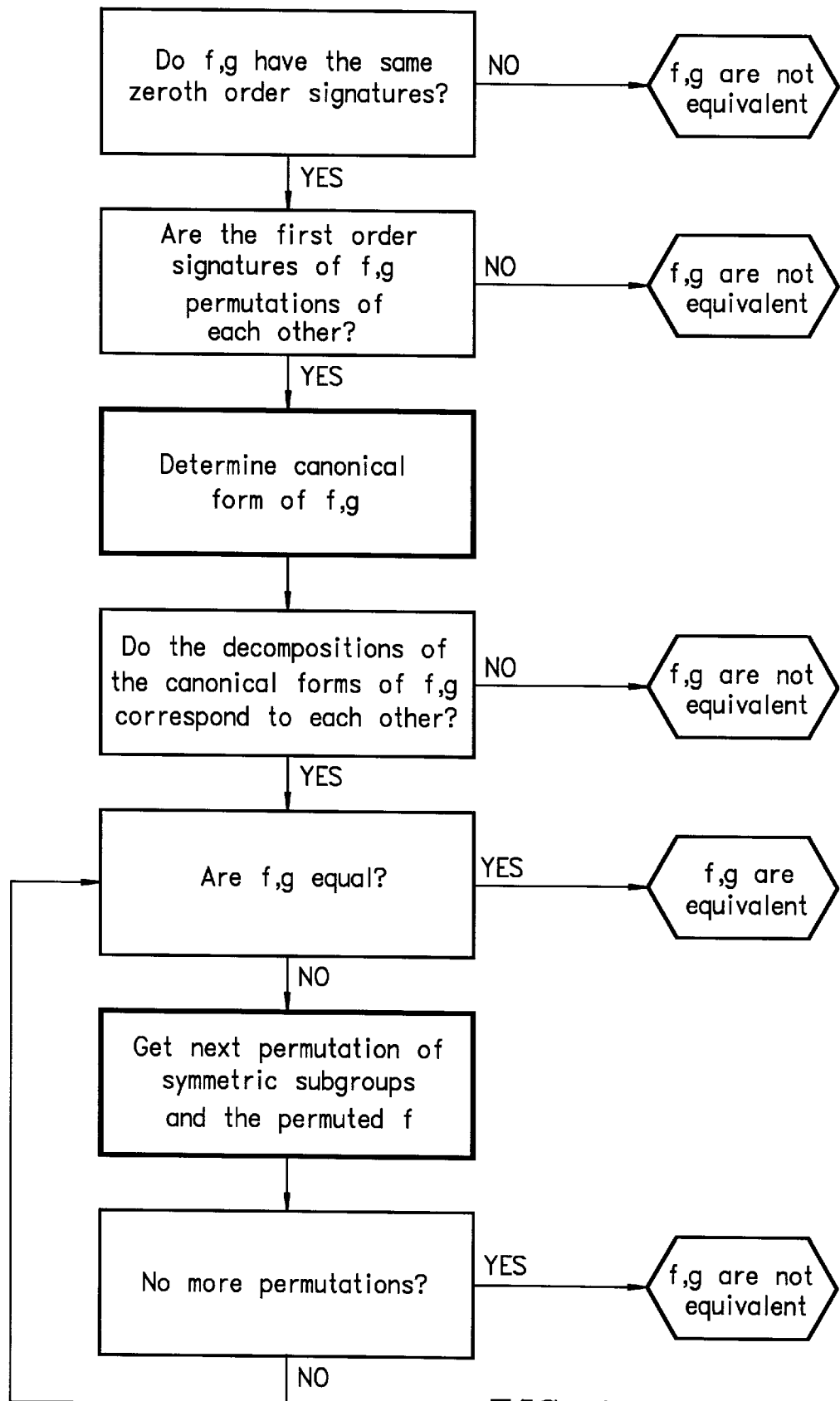
FIG. 4 is a schematic illustrating the process flow for matching Boolean functions in accordance with the invention.
Figure 5:
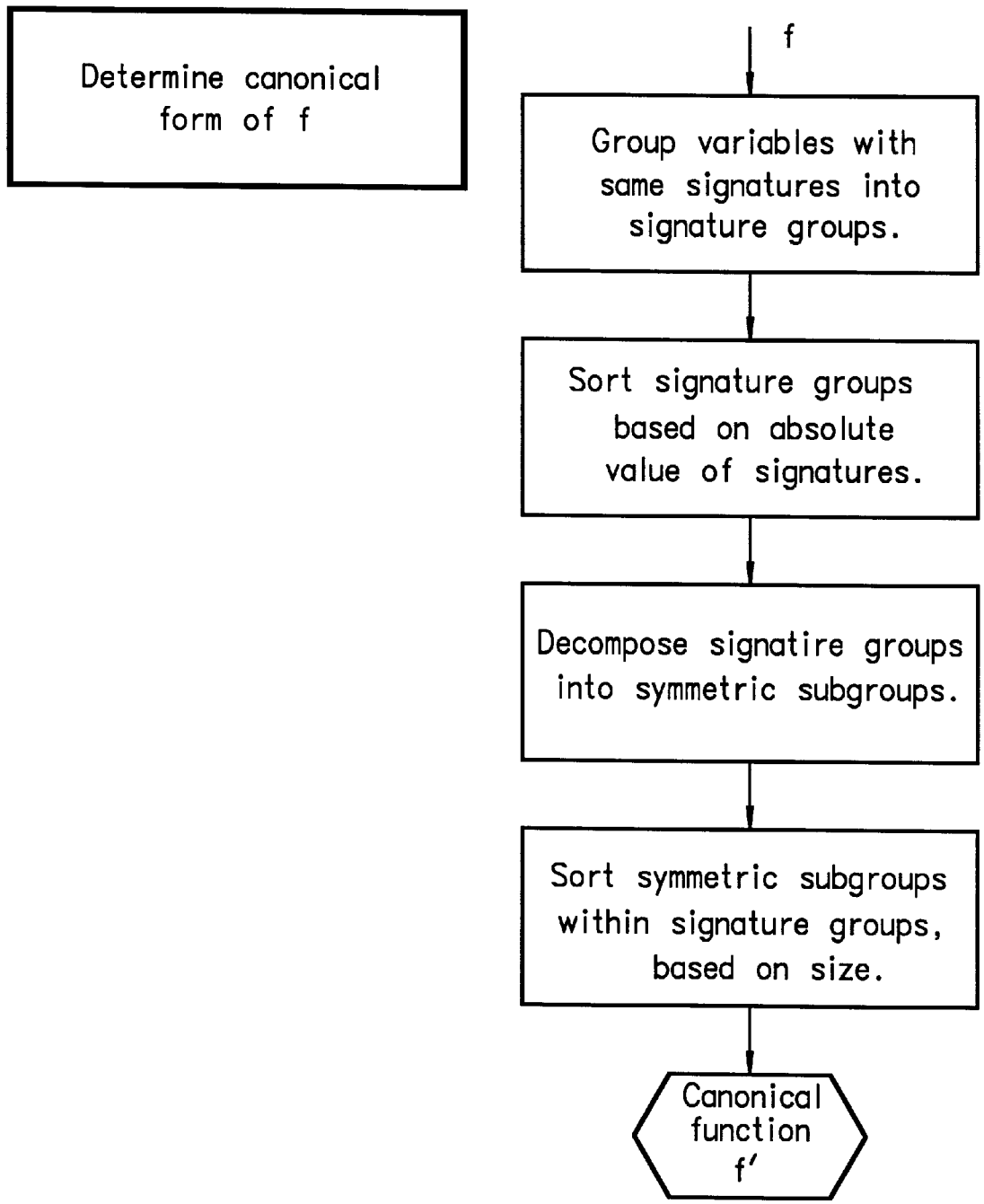
FIG. 5 is a schematic illustrating the process flow for generating the canonical form of a function in accordance with the invention.
Figure 7:
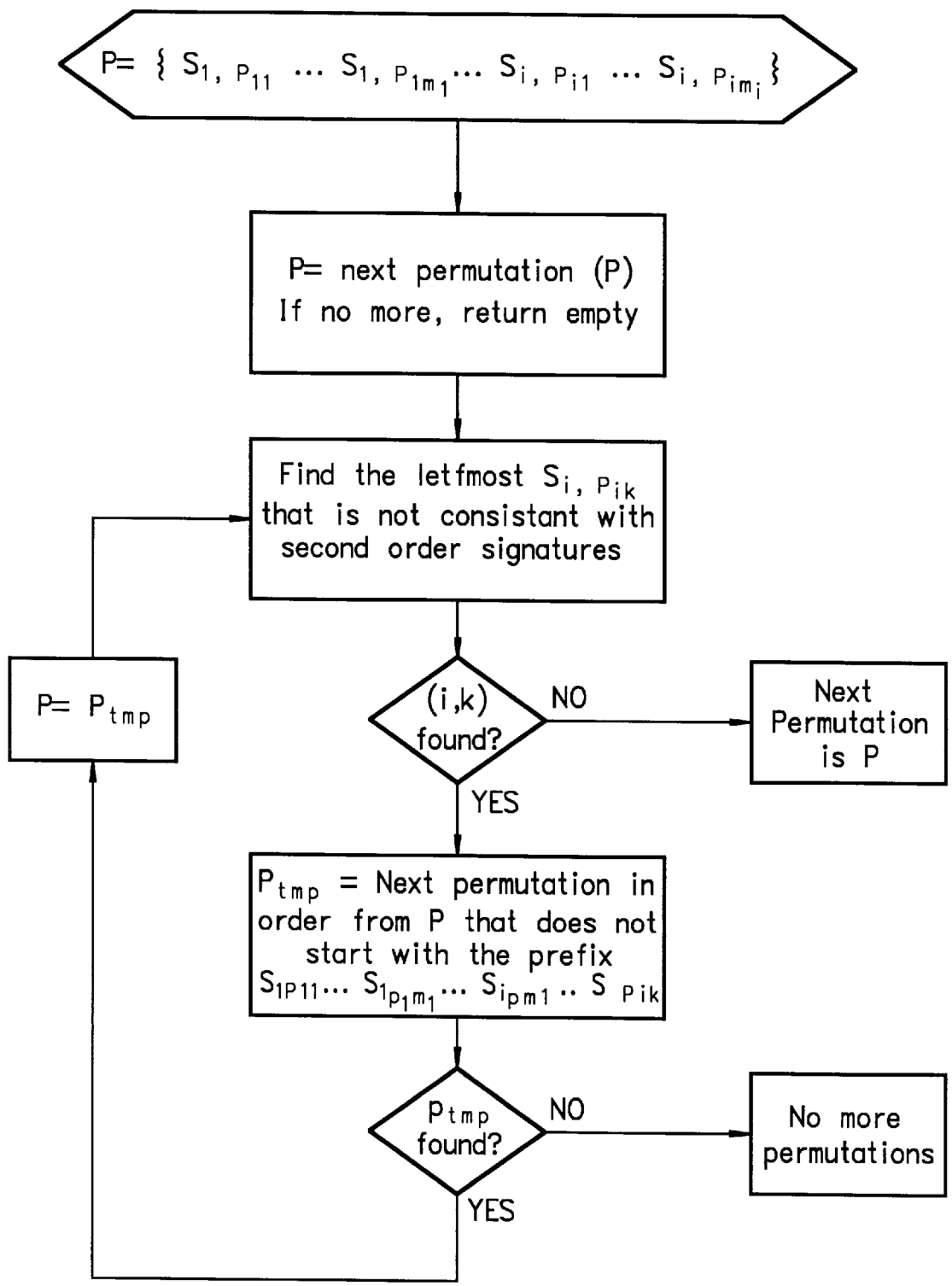
FIG. 7 is a schematic illustrating the process flow for getting the next permutation using second order signatures in accordance with the invention.

The process flow for comparing Boolean functions using their signatures is shown in FIGS. 4, 5, and 7. Although this invention will be described in terms of determining whether two functions are permutation equivalent, one skilled in the art will easily recognize that inversions may easily be checked by using first order signatures.

To begin with, the zeroth order Walsh coefficient (which will be the zeroth order signature) is computed for each of the functions f and g. The zeroth order Walsh coefficient of a function is defined as the number of ones in the truth table of the function. For example, a function f=A * B (also expressed as A AND B) would have the following truth table:

TABLE 1

| f | A | B |
|---|---|---|
| A | 0 | 0 |
| B | 0 | 1 |

There is only a single 1, so the zeroth order Walsh coefficient of this function would be 1. In another example, for $f(X_1, X_2, X_3, X_4, X_5, X_6)=(X_1+X_3)*(X_2+X_5)+X_4*X_6$, the zeroth order Walsh coefficient is 43.

If the two functions f and g are permutation equivalent, they must have the same value for the zeroth order Walsh coefficient. Equality of zeroth order Walsh coefficients is a necessary but not sufficient condition for f and g to be permutation equivalent. If the zeroth order Walsh coefficients do not match, f and g are not equivalent and the current library cell is eliminated from consideration as a possible match.

If the zeroth order Walsh coefficients do match, the first order Walsh coefficients of the functions f and g are compared. Each function has n first order Walsh coefficients, where n is the number of inputs to the function. For each input $X_i$ in the function f, a truth table (or BDD) for f XOR $X_i$ is generated. Then the first order Walsh coefficient of f with respect to the input $X_i$ is defined as the number of zeroes in the truth table, minus the number of ones in the truth table; i.e., First order Walsh coefficient(f, $X_i$)=# of 0s–# of 1s (in truth table of f XOR $X_i$)

The first order $i^{th}$ Walsh coefficient quantifies the role of the input variable $X_i$ in the function f.

Using the function $f(X_1, X_2, X_3, X_4, X_5, X_6)=(X_1+X_3)*(X_2+X_5)+X_4*X_6$ from above as an example, $X_1, X_2, X_3$, and $X_5$ all have first order Walsh coefficients of 18, and $X_4$ and $X_6$ have the first order Walsh coefficients of 14.

For two functions f and g to be permutation equivalent, it is a necessary but not sufficient condition for their respective lists of first order Walsh coefficients to be permutations of each other. If the lists of first order Walsh coefficients are not permutations of each other, then f and g are not equivalent and the current library cell is eliminated from consideration. The lists of first order Walsh coefficients may be checked by sorting them and comparing the sorted lists.

Comparison of the zeroth and first order Walsh coefficients for the candidate function and for the library cell function succeeds in identifying non-matches in the vast majority of the cases. However, there are some cases in which the functions f and g pass comparison of their zeroth and first order Walsh coefficients, yet are not equivalent. Thus, the next step is to convert both functions to their canonical forms, as shown in FIG. 5.

The first step in generating the canonical form of a function f involves grouping together all variables with the same first order Walsh coefficients (which will be the first order signatures). Then the signature groups thus created are ordered according to increasing order of absolute value of the signature. Within each signature group, the variables are grouped by symmetry. A variable $X_i$ is symmetric to a variable $X_j$ if interchanging $X_i$ and $X_j$ results in the same function. The symmetric subgroups within a signature group are then ordered in increasing order of size (number of variables). Groups of symmetry subgroups that all have the same signature (i.e. are in the same signature group) and the same number of elements are grouped together into permutation groups. Thus, the step of generating the canonical form may be viewed as generating an ordered series of permutation groups, as illustrated in FIG. 6.

Applying the process of generating canonical functions to the function $f(X_1, X_2, X_3, X_4, X_5, X_6)=(X_1+X_3)*(X_2+X_5)+X_4*X_6$, the first step results in the function $(X_1+X_3)*(X_2+X_4)+X_5*X_6$. In other words, the new $X_5$ corresponds to the old fourth variable and the new $X_4$ corresponds to the old fifth variable. The next step sorts the signature groups based on the absolute values of their signatures. This results in the function $X_1 * X_2+(X_3+X_5)*(X_4+X_6)$. The new variables $\{X_1, X_2\}$ form the first signature group, and they correspond to the old variables $\{X_5, X_6\}$. The variables $\{X_3, X_5, X_4, X_6\}$ form the second signature group, and they correspond to the old variables $\{X_1, X_3, X_2, X_4\}$. The variables $X_1$ and $X_2$ are symmetric to each other, and thus the first signature group has a single symmetric subgroup $\{X_1, X_2\}$. The variables X3, X5 are symmetric to each other and the variables $X_4, X_6$ are symmetric to each other, so the second signature group has two symmetric subgroups $\{X_3, X_5\}$ and $\{X_4, X_6\}$. The next step results in the function $X_1 * X_2+(X_3+X_4)*(X_5+X_6)$. The final step of sorting the symmetric subgroups within a signature group based on size does not result in any change in this example. The canonical form is therefore $f'=X_1 * X_2+(X_3+X_4)*(X_5+X_6)$.

The permutation groups for the canonical function $f'=X_1 * X_2+(X_3+X_4)*(X_5+X_6)$ would be $PG_1=[S_{11}=\{X_1, X_2\}]$ and $PG_2=[S_{21}=\{X_3, X_4\}, S_{22}=\{X_5, X_6\}]$.

After generating the canonical forms of f and g, the decompositions of the two canonical functions are checked for correspondence; i.e. the system checks whether the signature groups are decomposed into symmetric subgroups in a similar fashion in both functions. If the decompositions are not the same, then the functions are not permutation equivalent. If the decompositions are the same, the canonical functions are compared for direct Boolean equivalence. If they match, they are permutation equivalent. If they do not match, the variables of f' are permuted at the symmetric subgroup level (i.e. symmetric variables are permuted as a group), and the only permutations required involve permuting the symmetric subgroups within their permutation groups. After each permutation, the system checks for equality between the permuted f' and g'. If the two functions are found not to match for each of the permutations, then they are indeed not permutation equivalent. If a match is found, then they are permutation equivalent. FIG. 4 illustrates the flow of this process. For example, consider two permutation groups PG1 and PG2, containing symmetric subgroups {S11, S12, S13} and {S21, S22}, respectively. The permutations that may need to be evaluated are as follows:

TABLE 2

| |
|---|
| {S11, S12, S13, S21, S22} |
| {S11, S12, S13, S22, S21} |
| {S11, S13, S12, S21, S22} |
| {S11, S13, S12, S22, S21} |
| {S12, S11, S13, S21, S22} |
| {S12, S11, S13, S22, S21} |
| {S12, S13, S11, S21, S22} |
| {S12, S13, S11, S22, S21} |
| {S13, S11, S12, S21, S22} |
| {S13, S11, S12, S22, S21} |
| {S13, S12, S11, S21, S22} |
| {S13, S12, S11, S22, S21} |

The first order signatures may be used to determine inversions. When the canonical form of the function f is determined, the inputs are inverted so that all first order signatures are equal to or greater than zero. If a variable is inverted and used as the input to the function, then the signature of that variable in the new function will be the negative of the signature of the variable in the original function. If all of the signatures are nonzero, then this process reduces them to canonical forms that need only be permuted for a positive match. If the signatures are zero, then both the variable and its inversion must be tried.

With networks corresponding to complex functions with few signature groups and low symmetry, the amount of computation may be quite large because the system may have to try a large number of permutations even though permutation is performed only within permutation groups (thus reducing the number of permutations). For example, in a multiplexer (MUX) having n control inputs and $2^n$ data inputs, the first order signatures (Walsh coefficients) of all the control inputs are 0. The first order signatures of all the data inputs are $2^n$. There are thus two signature groups, one for the control inputs (which have signatures of 0), and one for the data inputs (which have signatures of $2^n$). In the control signature group, the variables are all asymmetric with respect to each other. Similarly, the variables are all asymmetric with respect to each other in the data signature group. Thus, there are n symmetric subgroups in the control signature group, and each of the symmetric subgroups is of size 1. The data signature group has $2^n$ symmetric subgroups of size 1. The permutation groups correspond to the signature groups. The number of permutations required would be at least $(2^n)!$, and for n=4, the system would have to try 20,922,789,888,000 permutations. This computation is intractable for all but the smallest values of n.

To limit the number of permutations that are tried during matching, the system computes the second order Walsh coefficient (which will be the second order signature) for each pair of input variables. For a function f with n inputs, the number of second order Walsh coefficients is $n * (n-1)/2$. For each pair $X_i, X_j$, where $i \ne j$, the second order Walsh coefficient is determined by the truth table of f XOR $X_i$ XOR $X_j$. The second order Walsh coefficient is the number of zeroes in the truth table, minus the number of ones in the truth table. In other words:

Second order Walsh coefficient (f, X, X)=# of 0s−# of 1s (in the truth table)

The second order Walsh coefficient quantifies the relationship between $X_i$ and $X_j$ in the function f. The second order Walsh coefficient for the pair $X_i$, $X_j$ is equal to the second order Walsh coefficients for pairs $X_k$ and $X_l$, where $X_k$ is in the same symmetric subgroup as $X_i$, and $X_l$ is in the same symmetric subgroup as $X_j$. In other words, for $X_i \in$ symmetric subgroup $S_1$ and $X_j \in$ symmetric subgroup $S_2$, the second order Walsh coefficient will be the same for any $X_k \in S_1$ and any $X_l \in S_2$. Therefore, the second order Walsh coefficients can be thought of as specifying values for pairs of symmetric subgroups.

The symmetric groups $S_1$ and $S_2$ are chosen from within a permutation group and therefore have the same signature and size (number of elements). As illustrated in FIG. 7, the system takes in the current permutation P and the second order signatures of the symmetric groups of the functions f and g (which are in canonical form as f' and g'). The first step is to generate the next permutation in the permutation order shown in Table 2. The new permutation P is then checked for consistency with the second order signatures of f and g from left to right. The consistency check is illustrated in FIG. 8.

Figure 8:
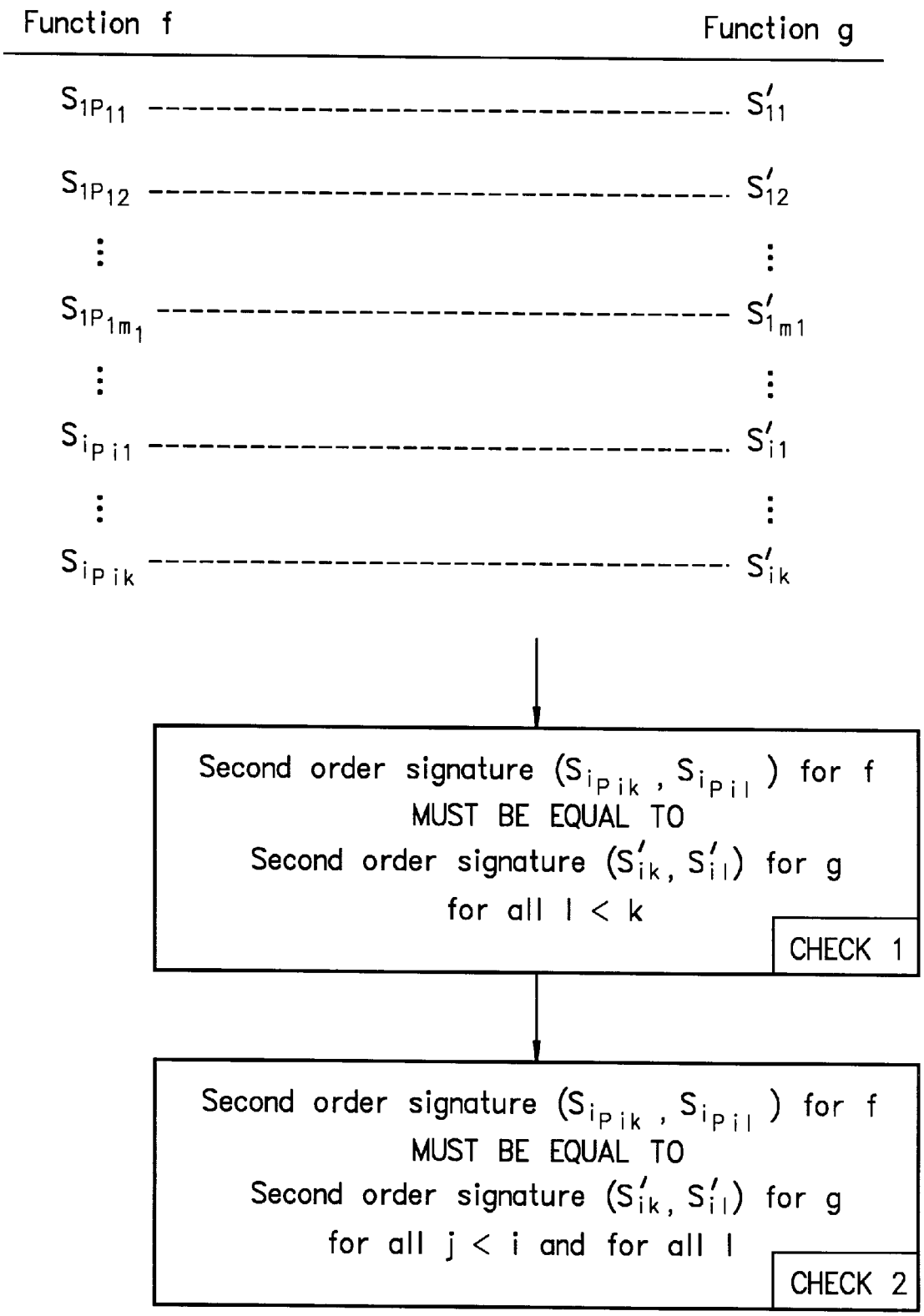
FIG. 8 is a schematic illustrating the table of permutations of symmetric subgroups and the process flow for checking in accordance with the invention.

One way to visualize this is to list the current permutation of symmetric groups of f alongside with the fixed ones for g (the library function) as shown in FIG. 8. A necessary condition for pairing $S_{i,pik}$ with $S'_{i,k}$ is that the second order signatures of $S_{i,pik}$ with all symmetric sub groups before it in f must be equal to the second order signatures for the corresponding pairs in g. The system determines the leftmost (or lexicographically smallest) (i, k) for which the consistency check does not hold good. If there is no such value, then P is the next permutation that will be tried by the system. If there is any inconsistency found, then P is assigned the next permutation in the permutation order that does not start with the old prefix $\{S_{1,p11}, \ldots S_{i,pik}\}$. If no such permutation P is found, then all the permutations have been generated. If such a permutation P is found, then the consistency check is repeated with the new permutation.

In short, as the system builds candidate permutations of f, it checks them for consistency with the second order signatures of g. During the building of a candidate permutation, the system produces an intermediate permutation and adds symmetric subgroups to it. For every symmetric subgroup added, the system checks the second order signatures of the newly-added symmetric subgroup in the intermediate permutation. As the system determines the second order signature for each pairing of the newly-added symmetric subgroup with each of the other symmetric subgroups already in the intermediate permutation, if the system finds that the second order signature does not match the corresponding second order signature in g, it ceases building that intermediate permutation and does not build any other permutations beginning with the sequence of the current intermediate permutation. Instead, the system continues building the previous intermediate permutation (without the newly-added symmetric subgroup), if possible. Thus, the system uses second order signatures to prune the number of permutations required. When all symmetric subgroups in the permutation group have been added to the intermediate permutation, and all second order signatures have passed the consistency check, the intermediate permutation becomes a candidate permutation.

For example, suppose that permutation group $PG_1 = \{S_{11}, S_{12}, S_{13}, S_{21}, S_{22}, S_{23}\}$. In building a candidate permutation of $PG_1$, the system initially puts $S_{11}$ into the group, then adds $S_{13}$ immediately after, giving the incomplete candidate permutation $\{S_{11} S_{13}\}$. The second order signature of f ($S_{11}$, $S_{13}$) is computed and found to match the corresponding second order signature in g. The system then adds $S_{12}$ to the candidate permutation, giving $\{S_{11}, S_{13}, S_{12}\}$ Because the second order signature of f ($S_{11, S13}$) has already been checked, the system does not check it again. The system checks f ($S_{11, S12}$), and the second order signature matches the corresponding second order signature in g. Then the system checks f ($S_{13}$, $S_{12}$) and finds that the second order signature does not match the corresponding signature in g. The system ceases building the candidate permutation (and thus does not add $S_{21}$, $S_{22}$, or $S_{23}$ to the permutation), and does not build any other permutations beginning with $\{S_{11}, S_{13}, S_{12}\}$. The system is thus able to eliminate six permutations, which is the number of permutations of the 3-element set $\{S_{21}, S_{22}, S_{23}\}$. The advantage of pruning is obviously greater for larger permutation groups.

Using this method to match two MUX functions, the number of permutations tried before a match is found can be shown to be exactly 1. This is because the control variables fall before the data variables in the canonical ordering. The ordering of the control variables together with second order signatures results in the generation of the unique data pin permutation in one shot. Thus, the method described above results in efficient matching for many complex functions, including the MUX. Another example of such a function is a series of functions $f = (X_1 * X_2 + X_3) * (X_4 * X_5 + X_7) \ldots (X_{3i+1} * X_{3i+2} + X_3 i +_3) \ldots$ It will be apparent to one of ordinary skill in the art that the process described above need not be repeatedly performed for library cell functions, and the relevant information (signatures, canonical form, etc.) may be stored in the library along with the cell to which it applies. This will speed the computation considerably.

The invention may thus be used to assist the automated design system in checking candidate clusters for realizability, and due to the reduction in computation time required for matching candidate clusters, the system is able to deal with more complex networks and larger library cells, as well as produce better results by working on larger regions at a time.

The process can be applied to different parts of a network by working on relatively small parts of the network at a time. The system may repeatedly extract a region of the network, generate candidate clusters, check candidate clusters for realizability, select library cells to map the region, and move to another region.

All references cited herein are intended to be incorporated by reference. Although the present invention has been described above in terms of a specific embodiment, it is anticipated that alterations and modifications to this invention will no doubt become apparent to those skilled in the art. It is therefore intended that the following claims be interpreted as covering all such alterations and modifications as fall within the true spirit and scope of the invention.

What is claimed is:

1. A method of generating a candidate permutation of a permutation group associated with a first function and including a plurality of symmetric subgroups to match a candidate cluster to cells in an existing cell library, comprising the steps of:
   (a) selecting a first symmetric subgroup;
   (b) selecting a second symmetric subgroup;
   (c) determining a second order signature for the first and second symmetric subgroups;
   (d) comparing the second order signature to a parallel second order signature for a second function in a technology library; and
   (e) if the second order signatures are equivalent, defining an intermediate permutation including the first and second symmetric subgroups, and if there are no unselected symmetric subgroups, returning the intermediate permutation as the candidate permutation.

2. The method as recited in claim 1, further comprising the step of generating no intermediate permutations beginning with the first and second symmetric subgroups, if the second order signatures are not equivalent.

3. The method as recited in claim 2, wherein the step of determining the second order signature comprises determining a second order Walsh coefficient of the first function, the first symmetric subgroup, and the second symmetric subgroup.

4. The method as recited in claim 3, wherein the first symmetric subgroup includes at least a first variable and the second symmetric subgroup includes at least a second variable, and wherein the step of determining the second order Walsh coefficient comprises determining a second order Walsh coefficient of the first function, the first variable, and the second variable.

5. The method as recited in claim 4, wherein the second function is a function in a technology library, and wherein the step of comparing includes retrieving the second order Walsh coefficient from the technology library.

6. The method as recited in claim 2, further comprising the steps of:
   (f) defining a further intermediate permutation including the intermediate permutation and a further symmetric subgroup from the permutation group;

(g) determining a further second order Walsh coefficient of the first function and each pairing of the further symmetric subgroup with each one of the symmetric subgroups in the intermediate permutation;

(h) comparing the further second order Walsh coefficient to a parallel further second order Walsh coefficient for the second function; and (i) if any further second order Walsh coefficient does not match the parallel further second order Walsh coefficient, generating substantially no intermediate permutations beginning with the further intermediate permutation; otherwise, including the further symmetric subgroup in the intermediate permutation.

7. The method as recited in claim 6, further comprising the step of applying steps (f)–(i) for a different further symmetric subgroup.

8. The method as recited in claim 7, wherein the step of determining the further second order signature comprises determining a second order Walsh coefficient of the first function and the symmetric subgroups in the pairing.

9. A method of generating a set of realizable clusters in a circuit to match a candidate cluster to cells in an existing cell library, comprising the steps of:

(a) defining a set of candidate clusters having associated candidate functions;

(b) comparing zeroth and first order signatures of a candidate function to zeroth and first order signatures of a function in a technology library;

(c) comparing second order signatures of the candidate function with the second order signatures of the library function to determine equivalence of the candidate and library functions;

(d) including the candidate cluster in the set of realizable clusters, if the signatures of the candidate function are equivalent to parallel signatures of the library function and the candidate function is equivalent to the library function; and (e) if the second order signatures are equivalent, defining an intermediate permutation including the first and second symmetric subgroups, and if there are no unselected symmetric subgroups, returning the intermediate permutations the candidate permutation.

10. The method as recited in claim 9, wherein the step of comparing comprises producing a canonical form of the candidate function including at least one permutation group having a plurality of subgroups, and permuting the permutation group while using second order signatures of pairings of subgroups to eliminate permutations.

11. The method as recited in claim 10, wherein the second order signatures are determined by computing second order Walsh coefficients of the candidate function and the subgroups in the pairing.

12. The method as recited in claim 11, wherein eliminating permutations comprises generating no permutations beginning with a sequence of subgroups whose second order signatures are not equivalent to parallel signatures of the library function.

13. A computer program product for generating a candidate permutation of a permutation group associated with a first function and including a plurality of symmetric subgroups to match a candidate cluster to cells in an existing cell library, comprising a computer usable medium having machine readable code embodied therein for performing the steps of:

(a) selecting a first symmetric subgroup;

(b) selecting a second symmetric subgroup;

(c) determining a second order signature for the first and second symmetric subgroup;

(d) comparing the second order signature to a parallel second order signature for a second function in a technology library; and (e) if the second order signatures are equivalent, defining an intermediate permutation including the first and second symmetric subgroups, and if there are no unselected symmetric subgroups, returning the intermediate permutations the candidate permutation.

14. The computer program product as recited in claim 13, further configured to perform the step of generating no intermediate permutations beginning with the first and second symmetric subgroups, if the second order signatures are not equivalent.

15. The computer program product as recited in claim 14, wherein the step of determining the second order signature comprises determining a second order Walsh coefficient of the first function, the first symmetric subgroup, and the second symmetric subgroup.

16. The computer program product as recited in claim 15, wherein the first symmetric subgroup includes at least a first variable and the second symmetric subgroup includes at least a second variable, and wherein the step of determining the second order Walsh coefficient comprises determining a second order Walsh coefficient of the first function, the first variable, and the second variable.

17. The computer program product as recited in claim 16, wherein the second function is a function in a technology library, and wherein the step of comparing includes retrieving the second order Walsh coefficient from the technology library.

18. The computer program product as recited in claim 14, further configured to perform the steps of:

(f) defining a further intermediate permutation including the intermediate permutation and a further symmetric subgroup from the permutation group;

(g) determining a further second order Walsh coefficient of the first function and each pairing of the further symmetric subgroup with each one of the symmetric subgroups in the intermediate permutation;

(h) comparing the further second order Walsh coefficient to a parallel further second order Walsh coefficient for the second function; and (i) if any further second order Walsh coefficient does not match the parallel further second order Walsh coefficient, generating substantially no intermediate permutations beginning with the further intermediate permutation; otherwise, including the further symmetric subgroup in the intermediate permutation.

19. The computer program product as recited in claim 18, further configured to perform the step of applying steps (f)–(i) for a different further symmetric subgroup.

20. The computer program product as recited in claim 19, wherein the step of determining the further second order signature comprises determining a second order Walsh coefficient of the first function and the symmetric subgroups in the pairing.

* * * * *